US011251783B1

(12) United States Patent
Dolgin et al.

(10) Patent No.: US 11,251,783 B1
(45) Date of Patent: Feb. 15, 2022

(54) DEMODULATION METHODS AND DEVICES FOR FREQUENCY-MODULATED (FM) SIGNALS

(71) Applicant: Raytheon Company, Waltham, MA (US)

(72) Inventors: Benjamin P. Dolgin, Alexandria, VA (US); Andrew M. Kowalevicz, Arlington, VA (US); Gary M. Graceffo, Burke, VA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 17/122,872

(22) Filed: Dec. 15, 2020

(51) Int. Cl.
*H03K 5/00* (2006.01)
*H03K 5/19* (2006.01)
*H03K 7/06* (2006.01)
*H03K 5/1534* (2006.01)

(52) U.S. Cl.
CPC ....... *H03K 5/00006* (2013.01); *H03K 5/1534* (2013.01); *H03K 5/19* (2013.01); *H03K 7/06* (2013.01); *H03K 2005/00104* (2013.01)

(58) Field of Classification Search
CPC .... H03K 5/00006; H03K 5/1534; H03K 7/06; H03K 5/19; H03K 2005/00104
USPC ...................................................... 327/113
See application file for complete search history.

(56) References Cited

U.S. PATENT DOCUMENTS

| 5,847,853 | A  | 12/1998 | Farnworth |
| 6,304,355 | B1 | 10/2001 | Farnworth |
| 7,492,795 | B1 * | 2/2009 | Delfyett ................ H01S 3/1109 372/18 |
| 8,411,351 | B2 | 4/2013 | McCallion et al. |
| 9,813,151 | B2 | 11/2017 | Kingsbury et al. |
| 9,973,281 | B2 | 5/2018 | Kowalevicz et al. |
| 10,177,856 | B2 | 1/2019 | Kowalevicz et al. |

(Continued)

FOREIGN PATENT DOCUMENTS

JP    H0591047 A    4/1993

OTHER PUBLICATIONS

Zhang et al., "Microring-based modulation and demodulation of DPSK signal," Optics Express, vol. 15, No. 18, Sep. 2007, 6 pages.

(Continued)

*Primary Examiner* — Ryan Jager

(57) ABSTRACT

An apparatus includes a phase modulator configured to modulate a phase of an incoming frequency-modulated signal based on a clock signal to generate a phase-modulated signal, where the clock signal is associated with a clock frequency. The apparatus also includes an etalon configured to receive the phase-modulated signal and generate an output signal based on the phase-modulated signal. The apparatus further includes a detector configured to identify amplitudes associated with a first harmonic of the clock frequency and a first subharmonic of the clock frequency in the output signal. In addition, the apparatus includes a decoder configured to recover information encoded in the incoming frequency-modulated signal based on instantaneous frequency deviations of the incoming frequency-modulated signal, where the instantaneous frequency deviations are identified based on relative amplitudes of the first harmonic and the first subharmonic.

22 Claims, 7 Drawing Sheets

(56) References Cited

U.S. PATENT DOCUMENTS

| | | |
|---|---|---|
| 10,225,020 B2 | 3/2019 | Dolgin et al. |
| 10,243,670 B2 | 3/2019 | Kowalevicz et al. |
| 10,243,673 B2 | 3/2019 | Dolgin et al. |
| 10,250,292 B2 | 4/2019 | Graceffo et al. |
| 10,256,917 B2 | 4/2019 | Dolgin et al. |
| 10,305,602 B2 | 5/2019 | Dolgin et al. |
| 10,313,022 B2 | 6/2019 | Dolgin et al. |
| 10,374,743 B2 | 8/2019 | Dolgin et al. |
| 10,530,494 B2 | 1/2020 | Dolgin et al. |
| 10,571,774 B2 | 2/2020 | Graceffo et al. |
| 10,637,580 B2 | 4/2020 | Dolgin et al. |
| 10,686,533 B2 | 6/2020 | Dolgin et al. |
| 2006/0013591 A1 | 1/2006 | Rohde |
| 2007/0031150 A1 | 2/2007 | Fisher et al. |
| 2008/0226300 A1* | 9/2008 | Mayer ............... H04B 10/677 398/158 |
| 2008/0240736 A1 | 10/2008 | Ji et al. |
| 2008/0266573 A1 | 10/2008 | Choi et al. |
| 2011/0097085 A1 | 4/2011 | Oda et al. |
| 2012/0121271 A1 | 5/2012 | Wood |
| 2013/0272337 A1 | 10/2013 | Tan et al. |
| 2014/0314406 A1 | 10/2014 | Zerbe et al. |
| 2016/0013870 A1 | 1/2016 | Sorin et al. |
| 2018/0091227 A1 | 3/2018 | Dolgin et al. |
| 2018/0091228 A1 | 3/2018 | Kowalevicz et al. |
| 2018/0091230 A1 | 3/2018 | Dolgin et al. |
| 2018/0091232 A1 | 3/2018 | Dolgin et al. |
| 2018/0367223 A1 | 12/2018 | Graceffo et al. |
| 2019/0319714 A1 | 10/2019 | Kowalevicz et al. |
| 2019/0319715 A1 | 10/2019 | Kowalevicz et al. |

OTHER PUBLICATIONS

Arimoto et al., "High-speed free-space laser communication", Performance and Management of Complex Communications Networks, 1998, pp. 175-190.

Wright et al., "Adaptive optics correction into single mode fiber for a low Earth orbiting space to ground optical communication link using the OPALS downlink," Optics Express, vol. 23, Dec. 2015, 8 pages.

Andrews et al., "Final Report: Channel Characterization for Free-Space Optical Communications," Jul. 2012, 60 pages.

Juarez et al., "High-sensitivity DPSK receiver for high-bandwidth free-space optical communication links," Optics Express, vol. 19, May 2011, 8 pages.

International Search Report dated Dec. 15, 2017 in connection with International Patent Application No. PCT/US2017/053667, 4 pages.

Fang et al., "Multi-channel Silicon Photonic Receiver Based on Ring-resonators," Optics Express, vol. 18, No. 13, Jun. 2010, 6 pages.

Xu et al., "Optical Differential-Phase-Shift-Keying Demodulation Using a Silicon Microring Resonator," IEEE Photonics Technology Letters, vol. 21, No. 5, Mar. 2009, pp. 295-297.

Dolgin et al., "Hard-To-Intercept Multiple Coherent Transmitter Communications," U.S. Appl. No. 16/896,022, filed Jun. 8, 2020, 43 pages.

Dolgin et al., "Methods and Apparatus Supporting Non-Persistent Communications," U.S. Appl. No. 16/908,558, filed Jun. 22, 2020, 64 pages.

Written Opinion of the International Searching Authority dated Dec. 15, 2017 in connection with International Patent Application No. PCT/US2017/053667, 9 pages.

* cited by examiner

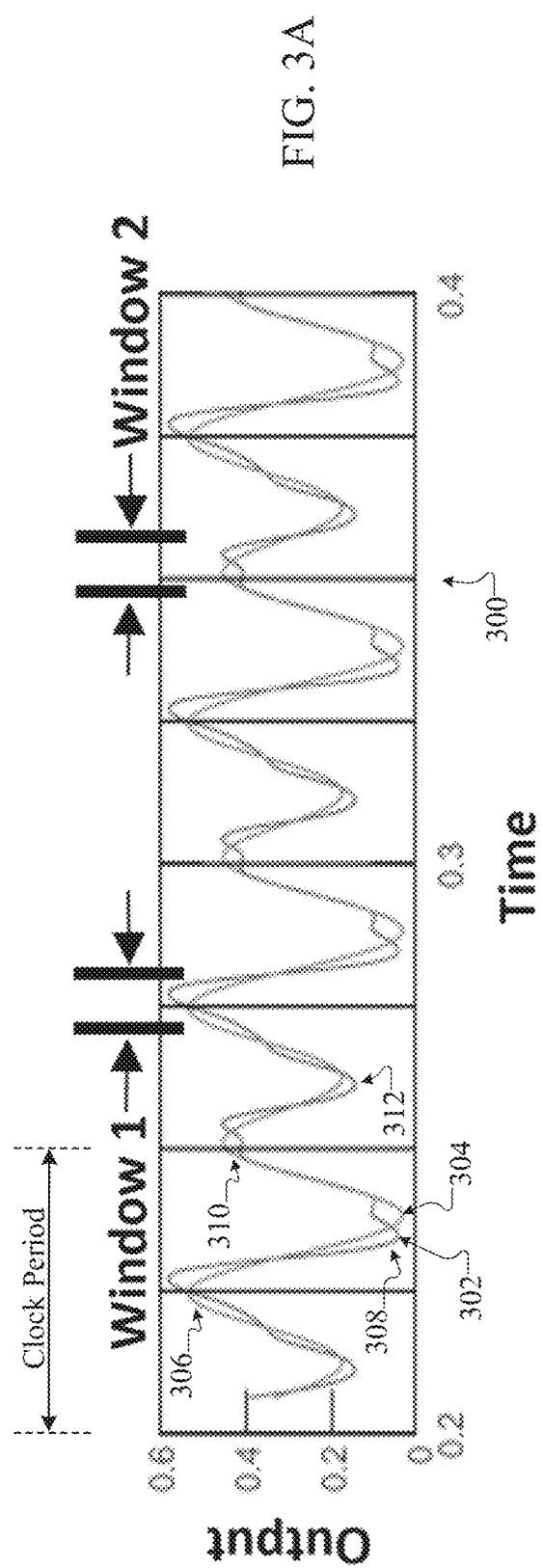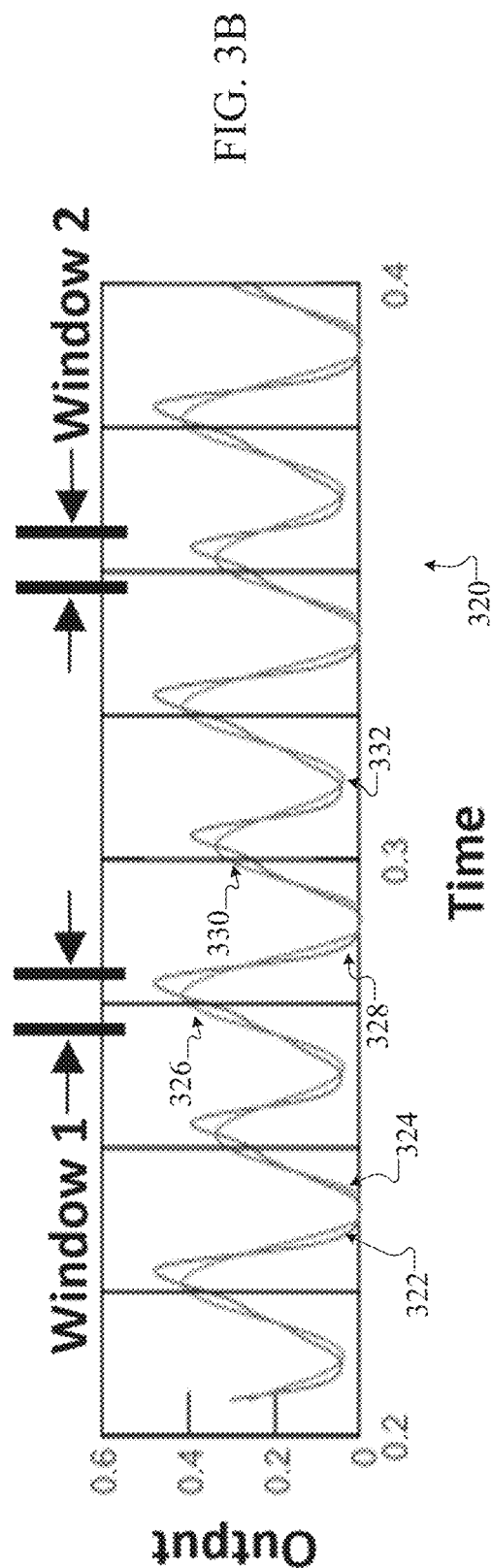
FIG. 3A
FIG. 3B

DEMODULATION METHODS AND DEVICES FOR FREQUENCY-MODULATED (FM) SIGNALS

TECHNICAL FIELD

This disclosure is generally directed to communication systems. More specifically, this disclosure is directed to demodulation methods and devices for frequency-modulated (FM) signals, such as frequency-modulated optical signals.

BACKGROUND

Light can be made to carry information by modulating a light source, such as a laser source, to change one or more properties of the light. For example, frequency-modulated (FM) light encodes information using variations in the frequency of the modulated light. The modulated light here may be in the visible spectral band, the infrared spectral band, or another region of the electromagnetic spectrum. An optical receiver can receive the modulated light and measure the variations in the one or more properties of the modulated light, such as the variations in the frequency of the modulated light. From these variations, it is possible for the optical receiver to recover the information from the modulated light.

SUMMARY

This disclosure is directed to demodulation methods and devices for frequency-modulated (FM) signals.

In a first embodiment, an apparatus includes a phase modulator configured to modulate a phase of an incoming frequency-modulated signal based on a clock signal to generate a phase-modulated signal, where the clock signal is associated with a clock frequency. The apparatus also includes an etalon configured to receive the phase-modulated signal and generate an output signal based on the phase-modulated signal. The apparatus further includes a detector configured to identify amplitudes associated with a first harmonic of the clock frequency and a first subharmonic of the clock frequency in the output signal. In addition, the apparatus includes a decoder configured to recover information encoded in the incoming frequency-modulated signal based on instantaneous frequency deviations of the incoming frequency-modulated signal, where the instantaneous frequency deviations are identified based on relative amplitudes of the first harmonic and the first subharmonic.

In a second embodiment, a method includes receiving an incoming frequency-modulated signal. The method also includes modulating a phase of the incoming frequency-modulated signal based on a clock signal to generate a phase-modulated signal, where the clock signal is associated with a clock frequency. The method further includes generating an output signal based on the phase-modulated signal using an etalon. The method also includes identifying amplitudes associated with a first harmonic of the clock frequency and a first subharmonic of the clock frequency in the output signal. In addition, the method includes recovering information encoded in the incoming frequency-modulated signal based on instantaneous frequency deviations of the incoming frequency-modulated signal, where the instantaneous frequency deviations are identified based on relative amplitudes of the first harmonic and the first subharmonic.

Other technical features may be readily apparent to one skilled in the art from the following figures, descriptions, and claims.

BRIEF DESCRIPTION OF THE DRAWINGS

For a more complete understanding of this disclosure, reference is now made to the following description, taken in conjunction with the accompanying drawings, in which:

FIGS. 3A and 3B illustrate example graphs plotting output signals generated by a detector used in a demodulator for frequency-modulated signals in accordance with this disclosure;

DETAILED DESCRIPTION

Figure 1:
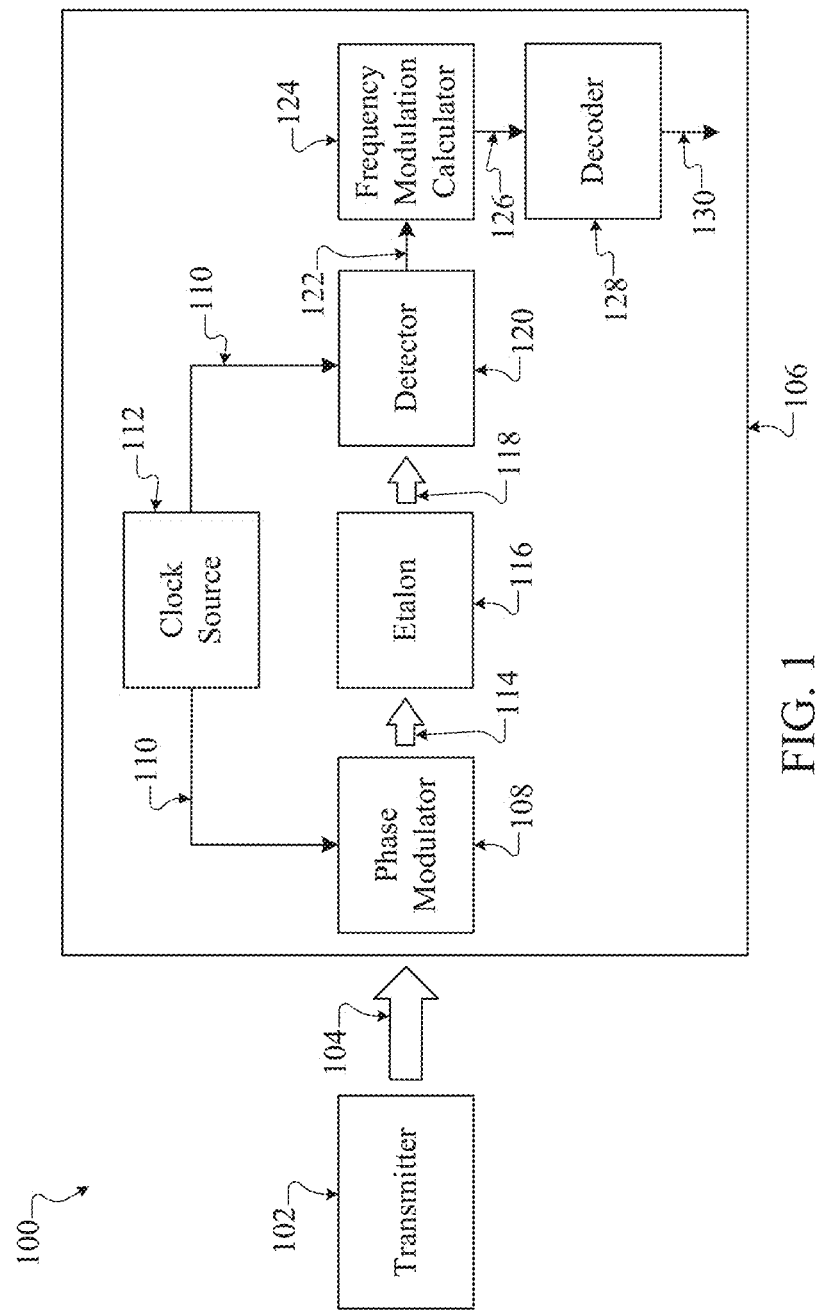
FIG. 1 illustrates an example communication system supporting demodulation of frequency-modulated (FM) signals in accordance with this disclosure.

FIGS. 1 through 6, described below, and the various embodiments used to describe the principles of the present invention in this patent document are by way of illustration only and should not be construed in any way to limit the scope of the invention. Those skilled in the art will understand that the principles of the present invention may be implemented in any type of suitably arranged device or system.

For simplicity and clarity, some features and components are not explicitly shown in every figure, including those illustrated in connection with other figures. It will be understood that any features and components illustrated in the figures may be employed in any of the embodiments described. Omission of a feature or component from a particular figure is for purposes of simplicity and clarity and is not meant to imply that the feature or component cannot be employed in the embodiments described in connection with that figure.

As described above, light can be made to carry information by modulating a light source, such as a laser source, to change one or more properties of the light. For example, frequency-modulated (FM) light encodes information using variations in the frequency of the modulated light. This is sometimes also referred to as wavelength modulation (since wavelength and frequency are related). The modulated light here may be in the visible spectral band, the infrared spectral band, or another region of the electromagnetic spectrum. An optical receiver can receive the modulated light and measure the variations in the one or more properties of the modulated light, such as the variations in the frequency of the modulated light. From these variations, it is possible for the optical receiver to recover the information from the modulated light.

Frequency modulation laser beam technology has been used in various applications to modulate the frequency of laser light. However, an FM-based optical detector typically relies on a local reference laser in order to generate a beat frequency between a reference laser signal and a received optical signal. The actual conversion is taking place at the detector and is therefore limited by the noise, non-linearity, and frequency bandwidth of the detector. While multiple interferometer-based approaches have been proposed, they rely on wavelength-level stability of an interferometer and direct measurement of the beat frequency. As a result, all of these approaches typically require the use of a laser or a very-precise clock source at an optical receiver, either of which may increase the cost, size, weight, and power (CSWAP) and overall complexity of the optical receiver.

This disclosure provides a demodulator for frequency-modulated signals. As described in more detail below, the demodulator receives and processes an incoming signal, such as in the form of frequency-modulated light or other frequency-modulated signal, in order to recover information from the incoming signal. One aspect of the processing of the incoming signal involves the phase modulation of the incoming signal, which may occur using a relatively-unstable local clock source. Another aspect of the processing of the incoming signal involves providing the phase-modulated signal to an etalon, which generates an output signal that is based on instantaneous frequency deviations contained in the phase-modulated signal. Still another aspect of the processing of the incoming signal involves the determination of harmonic amplitude ratio values using the output signal, where each ratio value represents a ratio associated with or based on a first subharmonic in the output signal and a first harmonic in the output signal. The ratio values can be determined over time for different portions or segments of the output signal as the incoming signal is received and the phase-modulated signal is transmitted through the etalon, and these ratio values can be used by a decoder to recover information from the incoming signal.

In this way, the demodulator is able to recover information from frequency-modulated light or other frequency-modulated signal without requiring the use of an ultra-stable reference laser (or other reference) or any reference laser beam (or other reference signal) and without requiring the use of a stable clock source. This can help to reduce the C SWAP and overall complexity of the demodulator and a receiver or other device that includes the demodulator. In some cases, the demodulator may require fewer or no tunable components (compared to other types of demodulators), which again can help to reduce the CSWAP and overall complexity of the demodulator and the receiver or other device that includes the demodulator. Moreover, the demodulator can be used to process a frequency-modulated signal even when the exact wavelength of the frequency-modulated signal is unknown by the demodulator. In addition, the demodulator can perform demodulation of a signal utilizing instantaneous frequency deviations higher than the bandwidth of available standard photodetectors. This is because photodetectors that are bandwidth-limited to a baseband signal may be used in conjunction with phase and intensity modulators in the demodulator, and the phase and intensity modulators can have higher bandwidths than the photodetectors. Overall, the demodulator here supports a general approach for the detection of frequency variations/deviations in frequency-modulated signals, which allows the demodulator to effectively recover information from the frequency-modulated signals.

Note that the description below often focuses on examples from the optical domain and refers to the use of frequency-modulated optical signals, meaning information can be encoded on and recovered from at least one frequency-modulated signal. However, it will be appreciated that the techniques and concepts described here are not limited to the optical domain and are applicable to signals in other regions of the electromagnetic spectrum, such as radio frequency signals, infrared signals, and ultra-violet signals.

This type of functionality may find use in a large number of applications. Examples of various systems in which demodulation of frequency-modulated signals may be useful or beneficial can include communication systems (including long-range and ground-to-space/space-to-ground communication systems such as satellite Internet systems), target designators, laser guidance systems, laser sights, laser scanners, three-dimensional (3D) scanners, homing beacons, surveying systems, long-distance sensors, remote weather stations, sonars, radars, time-off-light systems (such as LADAR and LIDAR), spectrometers (which are often described as using wavelength modulation), and other terrestrial or space-based applications. As particular examples, demodulation of frequency-modulated signals may be useful or beneficial in 5G or other communication systems to support functions such as backhaul transport or to provide optical gateways. In at least some of these examples, at least one signal is emitted and travels via at least one free space signal path (known as free space optical or "FSO") to at least one receiver, which can include one or more instances of the demodulator. Although typically for use in free space propagation, the features and components described here may be utilized in other embodiments, such as those employing at least one fiber coupling, other waveguide system, or other transmission medium. Also, in particular ones of these applications, one or more frequency-modulated radio frequency (RF) signals may be used to modulate one or more sources to create frequency-modulated laser light, and at least one receiver can include one or more instances of the demodulator in order to receive and process the frequency-modulated laser light. In general, one or more instances of the demodulator described in this patent document may be used in any suitable device or system in order to receive and process frequency-modulated signals, regardless of the source(s) of the frequency-modulated signals and regardless of how the information recovered from the frequency-modulated signals is used.

Those of ordinary skill in the art will understand that signals modulated to carry information have one or more characteristics that are changed by a transmitter in either a continuous or discrete fashion or some combination of the two, and segments of the signal over time may be associated with the particular characteristic(s) indicating the information being conveyed. For example, a frequency-modulated digital optical transmitter may encode data values onto light by varying the instantaneous frequency of the light. The light emitted to indicate each data value may be considered a segment or length of light whose instantaneous frequency indicates the data value. Later, the transmitter alters the light characteristic to emit a second segment of light to indicate a second data value, then a third segment of light, then a fourth segment of light, and so on. As will be appreciated, a "symbol" is transmitted within each segment, and the segment length is often referred to as the symbol length. The rate at which the transmitter discretely alters the characteristic, as in this example, is a modulation rate of the transmitter, which is also known as a symbol rate. Each segment of light has an associated physical length that is based upon the duration and the speed of light in the propagation medium. For example, a modulation rate of $10^8$ symbols per second (100 million transitions per second) emits light segments of 10 nanosecond duration with a length of approximately 3 meters in air or a vacuum. Higher modulation rates generate shorter light segments, and lower modulation rates generate longer light segments. Various embodiments of the demodulator here can operate at any suitable transmission rate(s), possibly including higher transmission rates like 1 trillion transitions per second (1 Giga symbol/sec) or more. It will also be understood that a single light segment may have one of multiple frequency values (and possibly amplitude values), and therefore each indicated value may be a multi-bit binary value (symbol). Accordingly, modulation rate is not necessarily equal to a transmission bit rate for a transmission system. The same or similar operations may occur for other types of frequency-modulated signals.

Some communication systems may alter different or additional signal characteristics in addition to frequency modulation of a signal, such as amplitude or phase, and may also vary the modulation rate over time, such as based on channel characteristics, noise, error rate, and the like. Additionally, some communication systems may modulate a signal in an analog fashion, such as by a continuous variation in amplitude of the signal, and therefore not employ a modulation rate per se. For purposes of this disclosure, aspects and embodiments are generally described in the context of a discrete communication system including frequency modulation, although it will be understood that aspects and embodiments disclosed here may be equally useful as transmitters and receivers for transmission systems that generate signals conveying information differently than that described (such as a combination of frequency and amplitude modulations).

In addition, it will be understood that examples of systems and methods discussed here are not limited in application to the details of construction and the arrangement of components set forth in the following description or illustrated in the drawings. The systems and methods are capable of implementation in other examples and of being practiced or carried out in various ways. Examples of specific implementations are provided here for illustrative purposes only and are not intended to be limiting. Also, the phraseology and terminology used here are for purposes of description and should not be regarded as limiting. Thus, for example, any references to front and back, left and right, top and bottom, upper and lower, or vertical and horizontal are intended for convenience of description, not to limit the present systems and methods or their components to any one positional or spatial orientation.

FIG. 1 illustrates an example communication system 100 supporting demodulation of frequency-modulated signals in accordance with this disclosure. For simplicity, the following discussion related to FIG. 1 may focus on an example from the optical domain and may reference the use of optical transmit and receive components and optical signals. However, as discussed above, the techniques and concepts described here are not limited to optical domain systems only as would be apparent to those skilled in the art.

As shown in FIG. 1, the system 100 includes a transmitter 102, such as an optical transmitter, which generally operates to produce at least one frequency-modulated signal 104, such as frequency-modulated light. The transmitter 102 can use any suitable technique to generate a frequency-modulated signal 104. For example, the transmitter 102 may include at least one laser or other optical or other source(s) that can be controlled to modulate the frequency (and possibly one or more other characteristics) of light or other signal in order to encode information onto the signal and produce a frequency-modulated signal 104. Note, however, that this disclosure is not limited to any particular technique for generating one or more frequency-modulated signals 104.

The frequency-modulated signal 104 can be transmitted through free space or other transmission medium to a receiver 106, such as an optical receiver, which recovers the information encoded onto the frequency-modulated signal 104. In this example, the receiver 106 includes a phase modulator 108, which receives the frequency-modulated signal 104 from the transmitter 102. The phase modulator 108 operates to modulate the phase of the frequency-modulated signal 104 under the control of a clock signal 110 from a clock source 112. The modulation profile of the phase modulation here is controlled by the clock signal 110. In some embodiments, for example, the phase modulator 108 can modulate a frequency-modulated signal 104 based on a clock signal 110 having a substantially square or trapezoidal wave and a frequency of about 25 GHz. This type of modulation may support phase switching between +90° and −90°. However, any other suitable type of phase modulation may be used here. The phase modulator 108 includes any suitable structure configured to modulate the phase of a frequency-modulated signal, such as an electro-optic modulator (EOM).

The clock source 112 is used to generate one or more clock signals 110 for one or more components of the receiver 106. As described in more detail below, the clock source 112 need not represent a highly-accurate clock source and may be implemented using a relatively low-accuracy clock. In some cases, for example, the clock source 112 may have a clock frequency F that varies by as much as around one percent while still achieving adequate operation of the receiver 106. Of course, a clock source 112 with better accuracy may be used here. Thus, the use of a stable clock source with very high accuracy is not necessarily required in the receiver 106. The clock source 112 represents any suitable structure configured to generate a clock signal, such as a local oscillator.

The output of the phase modulator 108 represents a phase-modulated version of the frequency-modulated signal 104, and this phase-modulated signal 114 is provided to an etalon 116. The receiver 106 may be referred to as an "etalon-based" receiver since the receiver 106 includes the etalon 116. The etalon 116 generally reflects the phase-modulated signal 114 within the etalon 116 to create constructive and destructive interference of the waves of the phase-modulated signal 114. The etalon 116 generates an output signal 118 having peaks where constructive interference occurs and valleys where destructive interference occurs. Among other things, instantaneous frequency deviations in the incoming signal 104 cause corresponding changes in the output signal 118. For instance, the form of the output signal 118 can vary based on the instantaneous frequency deviations in the incoming signal 104 (as those frequency deviations are contained in the phase-modulated signal 114). As a result, the output signal 118 can be used to identify data values or symbols contained in the incoming signal 104 based on the instantaneous frequency deviations of the incoming signal 104.

The etalon 116 includes any suitable structure configured to generate an output signal related to instantaneous frequency deviations of an incoming signal. The etalon 116 may include any of a number of various types of devices or structures. In this document, the term "etalon" includes any of various structures, such as a Fabry-Perot etalon or other etalon, an optical resonator, an optical delay line, a microring, or an interferometer. The etalon 116 may be implemented in any suitable manner, such as by using a laminate, layer, film, coating, or the like or by using plates with reflecting surfaces and parallel mirrors with various materials (which may or may not include active optical materials) positioned in-between. Specific examples of optical resonators and other etalons are provided in U.S. Pat. No. 10,313,022 (which is hereby incorporated by reference in its entirety), although other etalons may be used here. For any etalon, the space in which a signal propagates or otherwise travels may be referred to generally as a "cavity," although this does not limit the actual design or operation of the etalon 116.

The dimensions and composition of the etalon 116 can be selected to provide desired operation in the receiver 106. For example, the length of the etalon 116 may be selected so that a total roundtrip length associated with the etalon 116 is 1,500 times the wavelength of the incoming signal 104. Of course, other lengths for the etalon 116 (possibly based on other total roundtrip lengths) may be used here. Also, the etalon 116 may support a suitable free spectral range (FSR), which is inversely proportional to the size of the etalon 116. In some cases, the etalon 116 may have a free spectral range of about 100 GHz, although other FSR values may be supported. Further, the etalon 116 may be fabricated from one or more materials having a low coefficient of thermal expansion (CTE) so that the size/length of the etalon 116 does not vary significantly during operation. As a particular example, the etalon 116 may be at least partially fabricated using quartz, which has a CTE of about 0.55 ppm/K (meaning any change in size of the etalon 116 may be generally irrelevant even when used over a wide temperature range, such as from absolute zero to 1000° C.). In addition, note that the etalon 116 might not be used here to support laser emission, meaning the etalon 116 would not be used to generate outgoing optical transmissions.

The output signal 118 generated by the etalon 116 is provided to a detector 120, which converts the output signal 118 into one or more electrical signals 122. Among other things, the detector 120 can be used as described below to detect one or more characteristics of the output signal 118. For example, the detector 120 may be used to measure amplitudes associated with the output signal 118, such as amplitudes associated with a first subharmonic and a first harmonic contained in the output signal 118. The first subharmonic represents the first subharmonic of the frequency F of the clock signal 110 as contained in the phase-modulated signal 114. The first harmonic represents the first harmonic of the frequency F of the clock signal 110 as contained in the phase-modulated signal 114. This information can be used by a frequency modulation calculator 124 to calculate frequency modulation or harmonic amplitude ratio values 126 associated with the incoming signal 104. Each ratio value 126 may be determined for a different segment of the incoming signal 104, and each ratio value 126 may be based on the amplitudes associated with the first subharmonic and the first harmonic in the associated segment of the incoming signal 104. The ratio values 126 generated over time can be used by a decoder 128 as an indicator of the instantaneous frequency deviations in the incoming signal 104, which allows the ratio values 126 to be used to recover information from the incoming signal 104 by the decoder 128.

Figure 5:
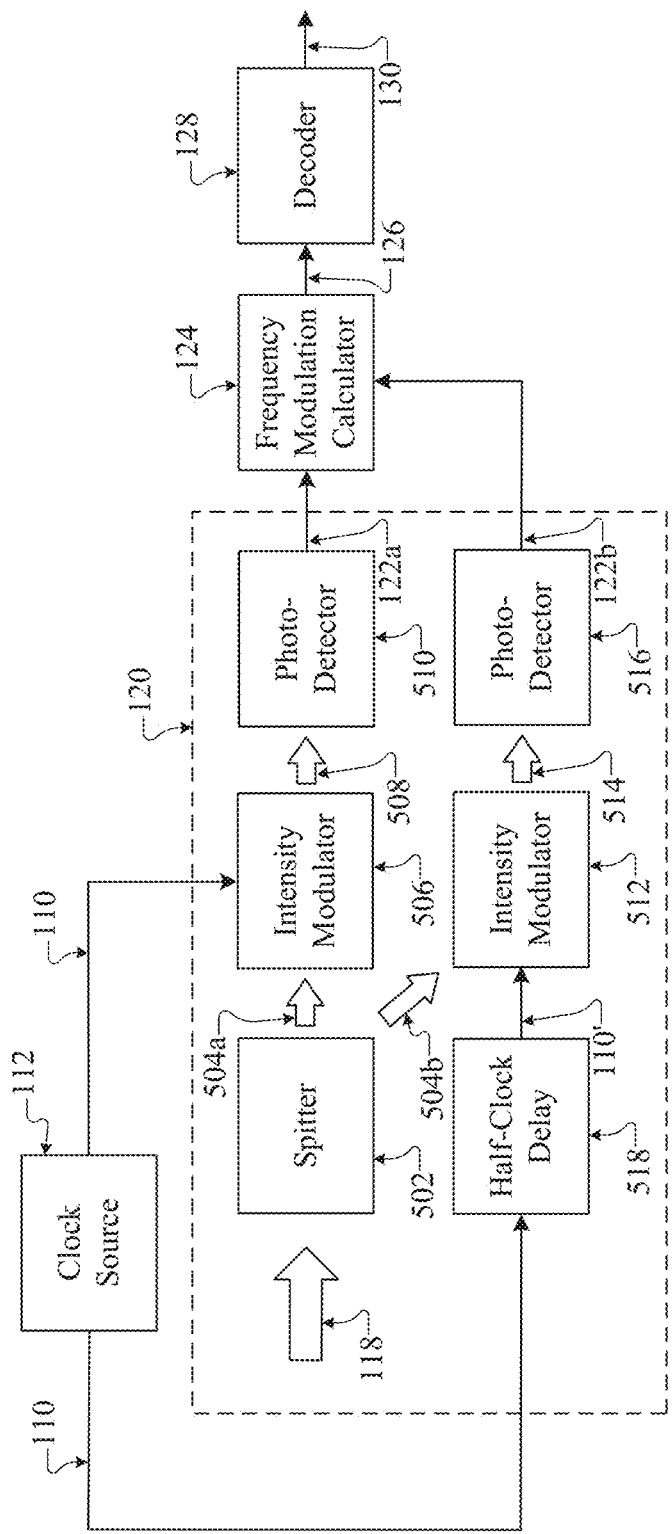
FIG. 5 illustrates a specific example embodiment of a detector used in a demodulator for frequency-modulated signals in accordance with this disclosure.

The detector 120 includes any suitable structure configured to measure one or more characteristics of a signal from an etalon. For example, the detector 120 may include one or more photodetectors, such as one or more photodiodes, or other electromagnetic detectors. One example implementation of the detector 120 is shown in FIG. 5, which is described below. The frequency modulation calculator 124 includes any suitable structure configured to calculate values based on amplitudes associated with subharmonics and harmonics contained in a signal from an etalon. In some embodiments, the frequency modulation calculator 124 may be implemented using one or more processing devices, such as one or more microprocessors, microcontrollers, digital signal processors (DSPs), field programmable gate arrays (FPGAs), or application-specific integrated circuits (ASICs).

The decoder 128 processes the ratio values 126 generated by the frequency modulation calculator 124 in order to generate an output signal 130 containing information recovered from the incoming signal 104. For example, the ratio values 126 can be generally related in a linear manner to the instantaneous frequency deviations of the incoming signal 104, so the ratio values 126 can be used to identify how the frequency of the incoming signal 104 changes over time (meaning the ratio values 126 can be used to identify the information that is represented by frequency modulations of the incoming signal 104). The decoder 128 includes any suitable structure configured to recover information based on ratio values associated with subharmonics and harmonics of a signal. The recovered information contained in the output signal 130 may be provided to any suitable destination(s) and used for any suitable purpose(s). The exact processing or use of the recovered information can vary widely based on the specific application for the receiver 106.

As noted above, in some embodiments, the phase modulator 108 can modulate the incoming signal 104 based on a clock signal 110 having a substantially square or trapezoidal wave and a frequency of about 25 GHz, where the phase of the phase-modulated signal 114 switches between +90° and −90° (although this is arbitrary and for illustration only). If the etalon 116 has an FSR of about 100 GHz, the clock signal 110 would therefore have a frequency that is about 25% of the etalon's FSR. Given a specific design of the etalon 116, the relationship between the instantaneous frequency variations of the incoming beam 104 and the ratio values based on the amplitudes associated with the first subharmonic and the first harmonic may be generally linear between 0 GHz and 20 GHz, which can be adequate to support suitable desired modulation or transmission rates. If the detector 120 can distinguish between positive and negative signs of the harmonics, the linearity range can be expanded, such as to a range of −20 GHz to +20 GHz. If non-linear response of the detector 120 is permitted, the range of can be expanded even more, such as to a range of −30 GHz to +30 GHz. Note here that the range of the frequency modulation (meaning the range of the instantaneous frequency deviations) is not related to the clock frequency F but rather, in some cases, to the FSR of the etalon 116. Also note that it may be assumed here that changes in frequency modulation of the incoming signal 104 are slower compared to the clock frequency F (meaning the frequency modulation of the incoming signal 104 does not change much over 1/F).

In this way, the receiver 106 supports a demodulator for at least one communication channel, where there is no need for a reference laser (or other reference source) or reference laser beam (or other reference signal) and no need for a precise clock source. Moreover, the exact frequency/wavelength of the incoming signal 104 need not be known by the receiver 106, and the etalon 116 need not represent a precision etalon (meaning the etalon 116 does not need to be tuned specifically to the incoming signal 104). This allows, for instance, the etalon 116 to change in size during operation due to expansion and contraction caused by temperature variations. In addition, the demodulator here can provide for improved CSWAP and may not require tuning during the operation of the receiver 106.

Although FIG. 1 illustrates one example of a communication system 100 supporting demodulation of frequency-modulated signals, various changes may be made to FIG. 1. For example, the transmitter 102 may generate multiple signals 104, and the receiver 106 may include multiple phase modulators 108, etalons 116, detectors 120, frequency modulation calculators 124, and decoders 128 (or a subset of these components) for use with different signals 104. Also, the receiver 106 may include any additional components as needed or desired in order to support one or more operations of the receiver 106 and/or one or more operations involving the signals 104.

Figure 2:
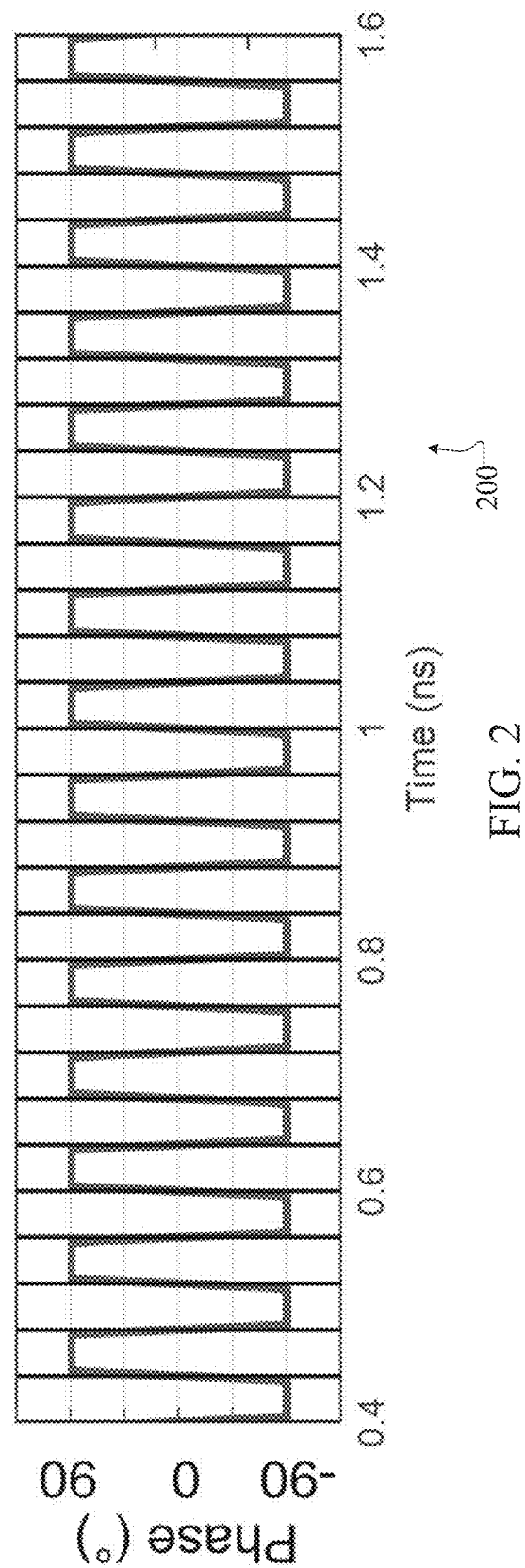
FIG. 2 illustrates an example graph plotting how much a phase modulator changes a phase of an incoming signal based on a clock signal used in a demodulator for frequency-modulated signals in accordance with this disclosure.

FIG. 2 illustrates an example graph 200 plotting how much a phase modulator 108 changes a phase of an incoming signal 104 based on a clock signal 110 used in a demodulator for frequency-modulated signals in accordance with this disclosure. In this example, the clock signal 110 is assumed to have a clock frequency F of 25 GHz. When the phase modulator 108 uses this clock signal 110, the phase of the incoming signal 104 can be phase-modulated and switched between ±90° phases. However, the specific phase angles used by the phase modulator 108 can vary. Also, it is assumed here that the clock signal 110 has a substantially square or trapezoidal waveform. However, a clock signal 110 with another waveform may be used here. For instance, another signal with a generally-constant frequency and a generally-symmetrical waveform may be used as the clock signal 110.

FIGS. 3A and 3B illustrate example graphs 300, 320 plotting output signals 122 generated by a detector 120 used in a demodulator for frequency-modulated signals in accordance with this disclosure. In FIGS. 3A and 3B, it is assumed the etalon 116 is receiving a phase-modulated signal 114 that is generated by the phase modulator 108 using a 25 GHz clock signal 110 with a substantially square or trapezoidal waveform and that the bandwidth of the detector 120 is limited to 25 GHz.

As shown in the graph 300 of FIG. 3A, a line 302 represents a modeled or ideal output of the etalon 116 for a first frequency modulation (a first instantaneous frequency deviation) of the incoming signal 104. A line 304 represents a summation of the first subharmonic and the first harmonic of the output signal 118 generated by the phase-modulated signal 114 for the first frequency modulation. As shown in the graph 320 of FIG. 3B, a line 322 represents a modeled or ideal output of the etalon 116 for a second frequency modulation (a second instantaneous frequency deviation) of the incoming signal 104. A line 324 represents a summation of the first subharmonic and the first harmonic of the output signal 118 generated by the phase-modulated signal 114 for the second frequency modulation.

As can be seen in FIGS. 3A and 3B, the sum of the first subharmonic and the first harmonic represented by each line 304 or 324 generally corresponds to the desired or ideal output represented by the corresponding line 302 or 322 with relatively high accurately. This is because the waveform of the output signal 118 varies based on the instantaneous frequency deviations in the received signal 104.

In this example, the waves of the etalon output in FIG. 3A successively vary between peaks 306 and 308 that are significantly different and successively vary between valleys 310 and 312 that are significantly different. In contrast, the waves of the etalon output in FIG. 3B successively vary between peaks 326 and 328 that are much closer (relative to FIG. 3A) and successively vary between valleys 330 and 332 that are much closer (relative to FIG. 3A). In some embodiments, the peaks 306, 326 and valleys 310, 330 may be associated with rising or leading edges of the clock signal 110, and the peaks 308, 328 and valleys 312, 332 may be associated with falling or trailing edges of the clock signal 110. Depending on the incoming signal 104 being processed, the peaks at the rising edges of the clock signal 110 may be larger or smaller than the peaks at the falling edges of the clock signal 110.

Based on this, the difference in the etalon output between a peak 306, 326 and a valley 310, 330 can define one amplitude, which predominantly represents the sum of the amplitudes of the first harmonic and the first sub-harmonic contained in the output signal 118. The difference in the etalon output between a peak 308, 328 and a valley 312, 332 can define another amplitude, which predominantly represents the difference between the amplitudes of the first harmonic and the first subharmonic contained in the output signal 118. The lack of higher harmonics here is due to the bandwidth of the receiver 106. The amplitudes associated with the first subharmonic and the first harmonic can be used to distinguish between different frequency modulations of the incoming signal 104 over time, which allows recovery of the information encoded on the incoming signal 104 by the different frequency modulations.

Although FIG. 2 illustrates one example of a graph 200 plotting how much a phase modulator 108 changes a phase of an incoming signal 104 based on a clock signal 110 used in a demodulator for frequency-modulated signals and FIGS. 3A and 3B illustrate examples of graphs 300, 320 plotting output signals 122 generated by a detector 120 used in a demodulator for frequency-modulated signals, various changes may be made to FIGS. 2, 3A, and 3B. For example, any other suitable clock signal 110 may be used here to change the phase of the incoming signal 104, including clock signals of different frequencies or pulse shapes. Also, the specific waveforms shown in FIGS. 3A and 3B can vary based on a number of factors, such as the design of the etalon 116 and the instantaneous frequency deviations that are contained in the incoming signal 104 actually being processed.

FIGS. 4A through 4D illustrate example characteristics associated with a demodulator for frequency-modulated signals in accordance with this disclosure. More specifically, FIGS. 4A through 4D illustrate example graphs 400, 420, 440, 460 plotting different linear relationships between ratio values 126 (which are based on amplitudes associated with the first subharmonic and the first harmonic in the output signal 118) and instantaneous frequency deviations in a signal 104.

Figure 4A:
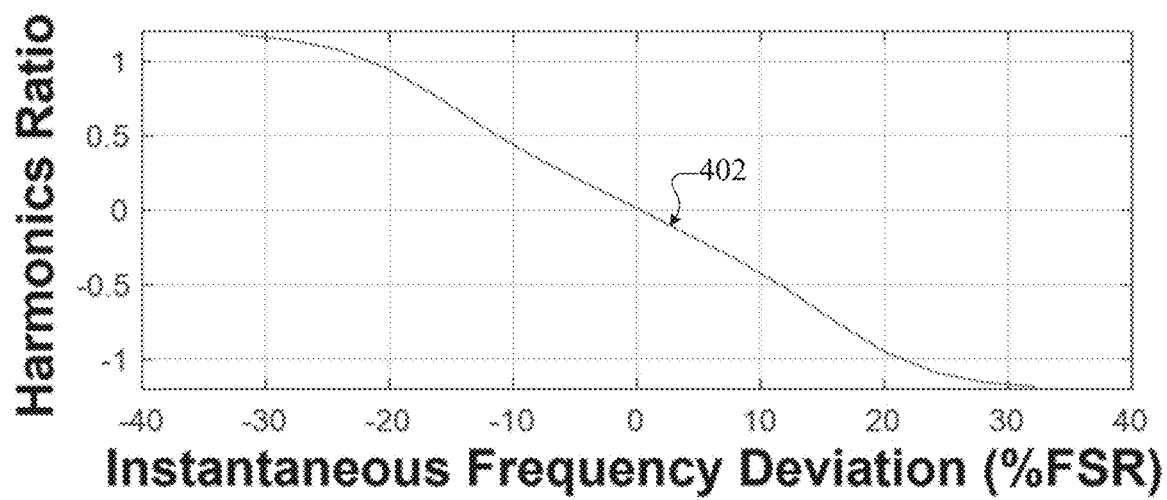
FIGS. 4A through 4D illustrate example characteristics associated with a demodulator for frequency-modulated signals in accordance with this disclosure.
Figure 4B:
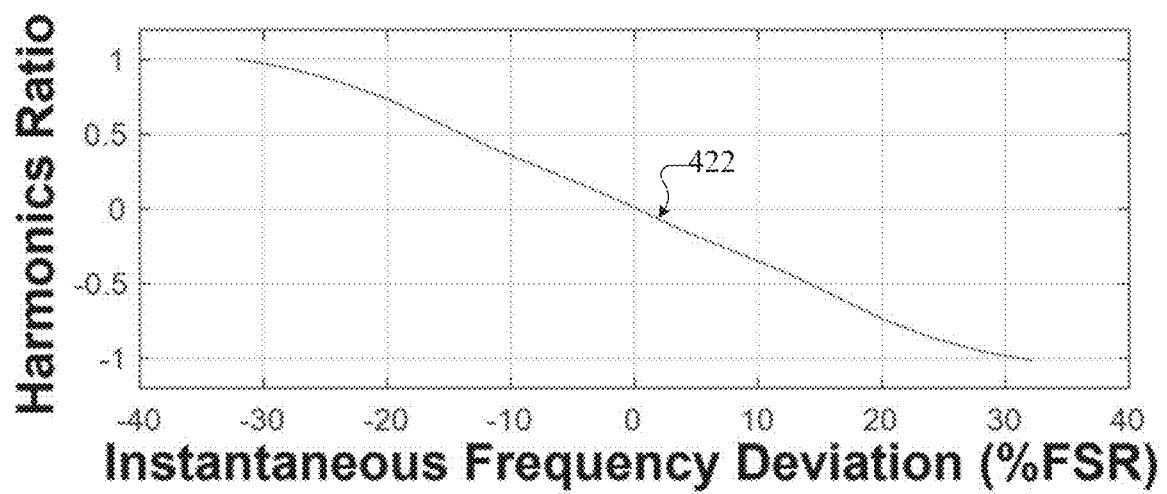
Figure 4C:
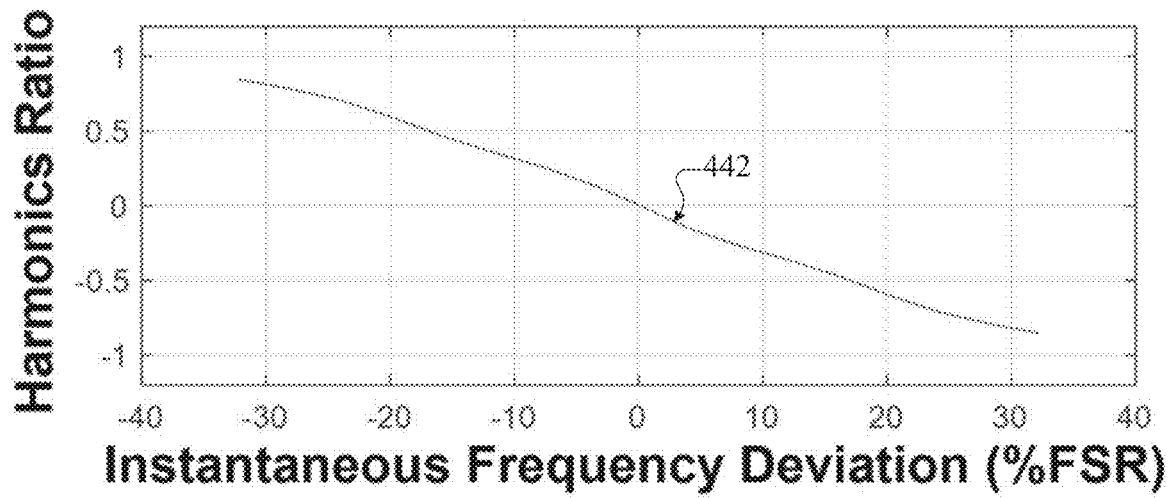
Figure 4D:
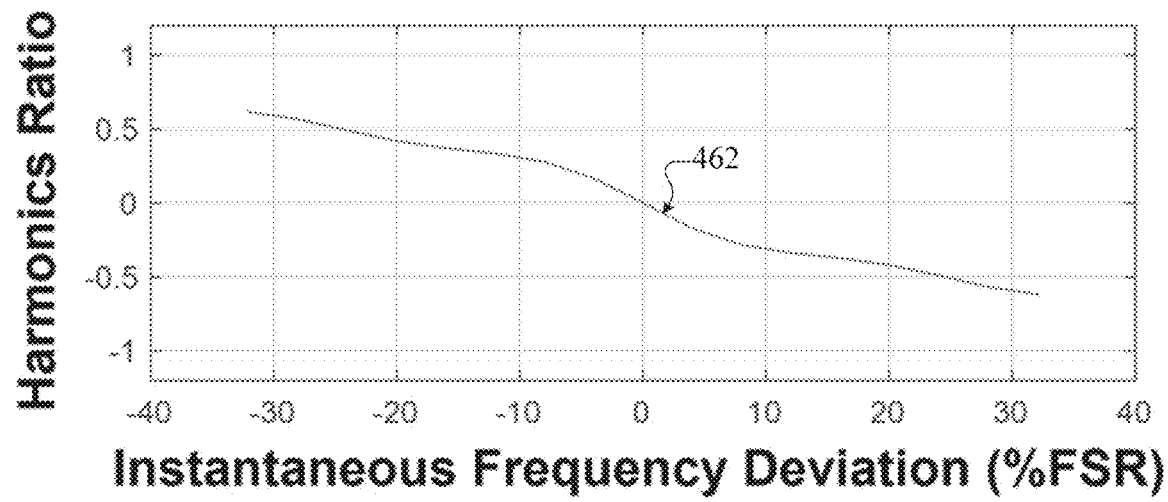

As shown in the graph 400 of FIG. 4A, a line 402 represents ratio values defined by a ratio of a first subharmonic to a first harmonic of an output signal 118 generated by an etalon 116 using a clock frequency F of 20 GHz. As shown in the graph 420 of FIG. 4B, a line 422 represents ratio values defined by a ratio of a first subharmonic to a first harmonic of an output signal 118 generated by an etalon 116 using a clock frequency F of 25 GHz. As shown in the graph 440 of FIG. 4C, a line 442 represents ratio values defined by a ratio of a first subharmonic to a first harmonic of an output signal 118 generated by an etalon 116 using a clock frequency F of 30 GHz. As shown in the graph 460 of FIG. 4D, a line 462 represents ratio values defined by a ratio of a first subharmonic to a first harmonic of an output signal 118 generated by an etalon 116 using a clock frequency F of 40 GHz.

As can be seen here, each line 402, 422, 442, 462 indicates that the ratio values are generally related in a linear fashion with the instantaneous frequency deviations of the incoming signal 104. This indicates that the ratio values can be used by the decoder 128 to identify the instantaneous frequency deviations of the incoming signal 104 over time and thereby recover information from the incoming signal 104. This also indicates that the ratio values depend primarily on the instantaneous frequency deviations of the incoming signal 104 and not primarily on the phase modulation frequency (the frequency of the clock signal 110) as long as the phase modulation frequency is not too high. In this example, the frequency of the clock signal 110 may be as high as 40% of the FSR of the etalon 116 while maintaining the generally linear relationship of the ratio values with the instantaneous frequency deviations of the incoming signal 104. Depending on the specific design of the etalon 116, the actual range of frequencies for the clock signal 110 can vary and be higher or lower, and the performance of the etalon 116 can scale with its FSR.

Although FIGS. 4A through 4D illustrate examples of characteristics associated with a demodulator for frequency-modulated signals, various changes may be made to FIGS. 4A through 4D. For example, the specific harmonics and ratio values here are for illustration only and can vary based on a number of factors. These figures are merely meant to indicate the basis for how example embodiments of a demodulator may operate. Also, as noted above, non-linear response of the detector 120 may be permitted, so there is no requirement that the demodulator rely on ratio values that are generally related in a linear fashion with the instantaneous frequency deviations of the incoming signal 104.

FIG. 5 illustrates a specific example embodiment of a detector 120 used in a demodulator for frequency-modulated signals in accordance with this disclosure. For ease of explanation, the detector 120 of FIG. 5 is described as being used within the receiver 106 in the communication system 100 of FIG. 1. However, the detector 120 may be used in any other suitable device and in any other suitable system.

In some cases, the detector 120 shown in FIG. 1 may be implemented using a photodiode or other photodetector or electromagnetic detector having a bandwidth that is wider than the frequency F of the clock signal 110 used for phase modulation. This would allow the detector to capture the amplitudes associated with both the first subharmonic and the first harmonic of the output signal 118. In these embodiments, a Fourier analysis may be performed using the measurements of the detector in order to identify the amplitudes associated with the first subharmonic and the first harmonic. However, the embodiment of the detector 120 shown in FIG. 5 assumes that the available photodetector or electromagnetic detector bandwidth is not wider than the frequency F of the clock signal 110. Given this assumption, the detector 120 shown in FIG. 5 uses intensity modulation to support suitable detection using the output signal 118 generated by the etalon 116. In those embodiments, a discrete Fourier transform may be used using the measurements of the detectors in order to identify the amplitudes associated with the first subharmonic and the first harmonic.

As shown in FIG. 5, the output signal 118 from the etalon 116 is received at a splitter 502, which divides the output signal 118 into two signals 504a-504b. In some cases, the splitter 502 may split the output signal 118 substantially equally, meaning each signal 504a-504b would contain about 50% of the power of the output signal 118. However, this is not necessarily required. The splitter 502 includes any suitable structure configured to split a signal, such as a 1×2 optical splitter or other splitter.

The signal 504a is provided to a first intensity modulator 506, which operates to perform intensity modulation (IM) of the signal 504a and produce a first intensity-modulated signal 508. For example, the first intensity modulator 506 can selectively block the signal 504a or allow passage of the signal 504a through the first intensity modulator 506 in order to generate the first intensity-modulated signal 508. The first intensity-modulated signal 508 is provided to a first photodetector 510, which generates an electrical signal 122a representing the measured intensity of the first intensity-modulated signal 508.

The first intensity modulator 506 is controlled by the clock signal 110 from the clock source 112. This may allow, for example, the first intensity modulator 506 to pass portions of the signal 504a during the front portion of each clock cycle of the clock signal 110. These portions of the signal 504a can be passed to the first photodetector 510 during time windows (referred to as "Window 1" in FIGS. 3A and 3B) that encompass one of the larger amplitudes of the signal 504a. These amplitudes of the signal 504a are related to the sum of the first harmonic and the first subharmonic. In some cases, each of the windows for allowing passage of the signal 504a may start at or near a rising edge of the clock signal 110, although other embodiments may be used.

Similarly, the signal 504b is provided to a second intensity modulator 512, which operates to perform intensity modulation of the signal 504b and produce a second intensity-modulated signal 514. For example, the second intensity modulator 512 can selectively block the signal 504b or allow passage of the signal 504b through the second intensity modulator 512 in order to generate the second intensity-modulated signal 514. The second intensity-modulated signal 514 is provided to a second photodetector 516, which generates an electrical signal 122b representing the measured intensity of the second intensity-modulated signal 514.

The second intensity modulator 512 is controlled by a delayed version of the clock signal 110, which is represented as a clock signal 110' here. This may allow, for example, the second intensity modulator 512 to pass portions of the signal 504b during the tail portion of each clock cycle of the clock signal 110. These portions of the signal 504b can be passed to the second photodetector 516 during time windows (referred to as "Window 2" in FIGS. 3A and 3B) that encompass another of the larger amplitudes of the signal 504b. These amplitudes of the signal 504b are related to the difference between the first harmonic and the first subharmonic. In some cases, each of the windows for allowing passage of the signal 504b may start at or near a falling edge of the clock signal 110, although other embodiments may be used. The clock signal 110' can be generated using a half-integer-clock delay 518, which delays the clock signal 110 by a time period substantially equal to 0.5, 1.5, 2.5, etc. clock cycles of the clock signal 110.

Effectively, the first intensity modulator 506 is used to isolate the portions of the signal 504a related primarily to the sum of the first harmonic and the subharmonic, and the first photodetector 510 is used to measure the intensity of those portions of the signal 504a to identify the amplitude of the sum. The second intensity modulator 512 is used to isolate the portions of the signal 504b related primarily to the difference between the first harmonic and the first subharmonic, and the second photodetector 516 is used to measure the intensity of those portions of the signal 504b to identify the amplitude of the difference. Here, the first and second photodetectors 510, 516 are capturing measurements at different delays relative to the clock signal 110. In some cases, one delay (such as for the photodetector 510) may be at or near zero, while another delay (such as for the photodetector 516) may be at or near 0.5, 1.5, 2.5, etc. clock cycles of the clock signal 110.

Each intensity modulator 506, 512 includes any suitable structure configured to modulate or otherwise adjust an intensity of a signal, such as a shutter. Each photodetector 510, 516 includes any suitable structure configured to measure an intensity of energy, such as a photodiode. Note, however, that other types of electromagnetic detectors may be used if other types of frequency-modulated signals are being processed here. The half-integer-clock delay 518 includes any suitable structure configured to delay a clock signal by a desired amount, such as a series of inverters or a conductive trace that is longer than a conductive trace carrying the clock signal 110 to the intensity modulator 506.

Note that the photodetectors 510 and 516 or other electromagnetic detectors may have a slower operational speed or bandwidth compared to the phase modulator 108 and the intensity modulators 506 and 512, meaning the phase modulator 108 and the intensity modulators 506 and 512 may have higher bandwidths than the photodetectors 510 and 516. For example, in some embodiments, the phase modulator 108 and the intensity modulators 506 and 512 may support a baseband signal bandwidth that is three to ten times larger than the bandwidth of the photodetectors 510 and 516. As a result, the photodetectors 510 and 516 may integrate the intensities of the signals 504a-504b over multiple cycles of the clock signal 110, with a number of cycles roughly equal to the ratio of the clock frequency and the detector bandwidth. This may be desirable in some cases, such as when it helps to increase the signal-to-noise ratio (SNR) of the measured intensities. Also note that the bandwidth of the phase modulator 108 can determine the maximum bandwidth of the baseband signal, and a higher phase modulator bandwidth increases the possible baseband signal bandwidth. In a two-detector system like the one shown in FIG. 5, the bandwidth of the photodetectors 510 and 516 can be based on the baseband signal bandwidth, rather than on the much-higher maximum instantaneous frequency deviation as in a single-detector design.

The measured intensities (amplitudes) generated by the photodetectors 510 and 516 are provided to the frequency modulation calculator 124, which can use the measured intensities to generate the ratio values 126. In some embodiments, the frequency modulation calculator 124 can determine a ratio value 126 for each segment of the incoming signal 104 using a formula of:

$$\text{Frequency Modulation} = K \times \frac{(D1 - D2)}{(D1 + D2)}$$

Here, Frequency Modulation represents a ratio value 126 that is based on the instantaneous frequency deviation in the associated segment of the incoming signal 104, and K represents a constant that can be measured or calculated based on the FSR of the etalon 116. Also, D1 represents a measured amplitude that is output by the photodetector 510 for the associated segment of the incoming signal 104 (which may occur at or near the leading edge of the clock signal 110), meaning D1 represents the sum of the first subharmonic and the first harmonic. In addition, D2 represents a measured amplitude that is output by the photodetector 516 for the associated segment of the incoming signal 104 (which may occur at or near the trailing edge of the clock signal 110), meaning D2 represents the difference between the first subharmonic and the first harmonic. Note that multiple values of D1 and D2 may be generated for multiple clock cycles within each segment of the incoming signal 104, in which case the measured values of D1 and D2 may be averaged or otherwise processed before calculating a ratio value for that segment. It should be noted here that when the instantaneous frequency deviation of the frequency-modulated signal becomes large, the linearity constant K becomes amplitude-dependent as is shown in FIG. 4. However, those skilled in the art will recognize that amplitude-dependent corrections may be used here to compensate.

Note that this specific formulation of the ratio values 126 is not simply a ratio of the first subharmonic amplitude and the first harmonic amplitude. However, by considering the ratio of the difference between D1 and D2 and the sum of D1 and D2, this formulation still represents ratio values that scale based on the similarity of the measured amplitudes of the first subharmonic and the first harmonic. In other embodiments, other formulas may be used to calculate the ratio values. Thus, this disclosure is not limited to any particular technique for determining the modulation of a signal based on ratios defined at least partially by the amplitudes of the first harmonic and the first subharmonic.

Although FIG. 5 illustrates one specific example embodiment of a detector 120 used in a demodulator for frequency-modulated signals, various changes may be made to FIG. 5. For example, as noted above, the detector 120 may be implemented using a single detector if the detector has an adequately-wide bandwidth. Also, the measurement of two intensities for the incoming signal 104 may not be needed in some cases. For instance, if the incoming signal 104 generated by the transmitter 102 has a constant amplitude, there may be no need to measure the intensity during some time windows. In those embodiments, the components used to generate the D1 values (namely the intensity modulator 506 and the photodetector 510) may be omitted, and the splitter 502 may not be needed. In addition, as noted above, the photodetector 510 and/or the photodetector 516 may be replaced with other types of electromagnetic detectors.

Figure 6:
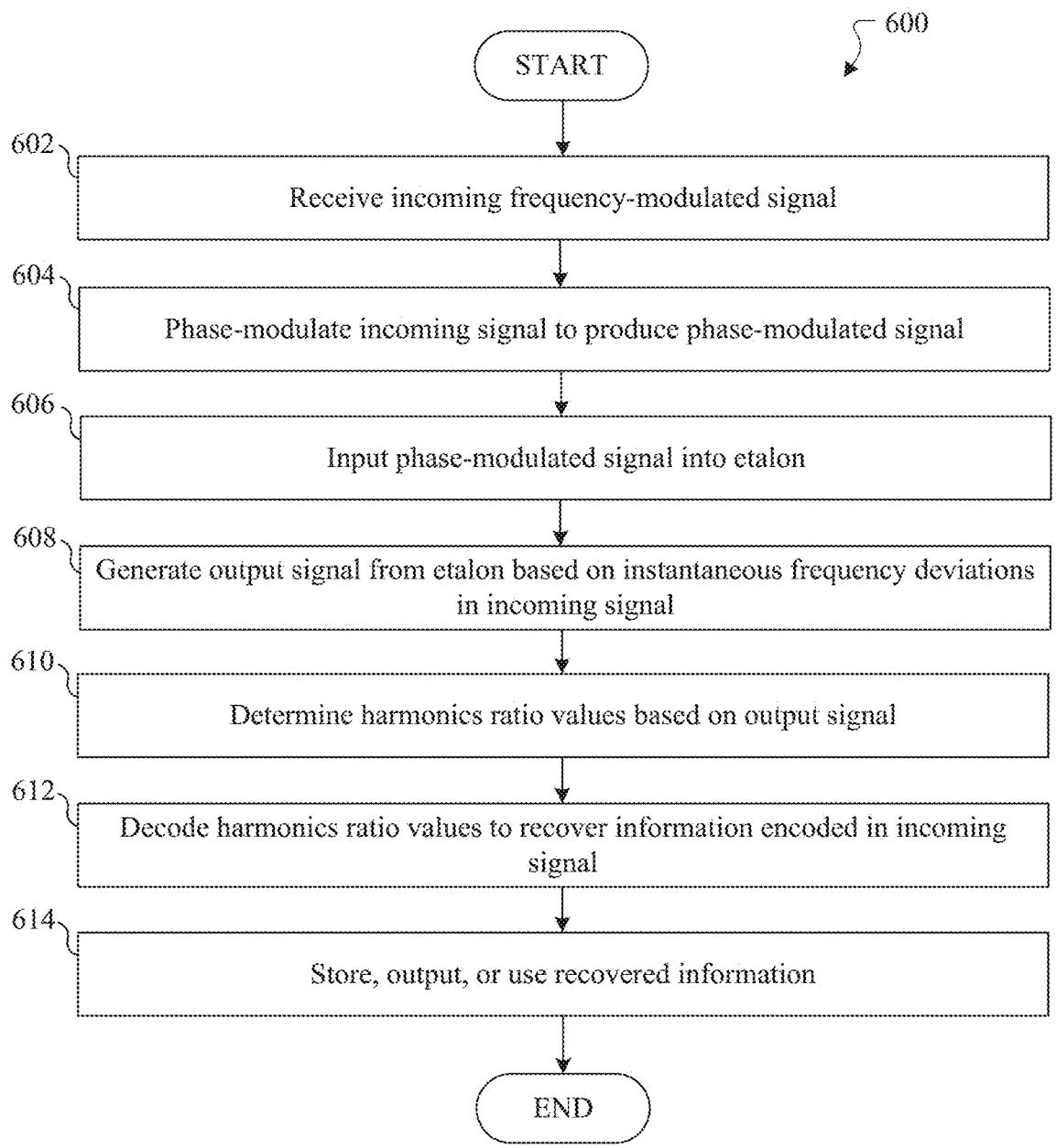
FIG. 6 illustrates an example method for demodulation of frequency-modulated signals in accordance with this disclosure.

FIG. 6 illustrates an example method 600 for demodulation of frequency-modulated signals in accordance with this disclosure. For ease of explanation, the method 600 of FIG. 6 is described as being performed using the receiver 106 in the communication system 100 of FIG. 1. However, the method 600 may be performed using any other suitable device and in any other suitable system.

As shown in FIG. 6, an incoming frequency-modulated signal is received at step 602. This may include, for example, the receiver 106 receiving the frequency-modulated signal 104 from the transmitter 102. The incoming signal is phase-modulated to produce a phase-modulated signal at step 604. This may include, for example, the phase modulator 108 modulating the phase of the incoming signal 104 based on the clock signal 110 from the clock source 112 to generate the phase-modulated signal 114. As noted above, the clock source 112 does not necessarily need to represent a high-accuracy clock source, although one may be used if desired.

The phase-modulated signal is input into an etalon at step 606, and an output signal is generated by the etalon at step 608. This may include, for example, providing the phase-modulated signal 114 into the etalon 116, where the phase-modulated signal 114 can be reflected and undergo constructive and destructive interference to generate the output signal 118. The constructive and destructive interference creates peaks and valleys in the output signal 118. As described above, the amplitudes associated with any given segment of the incoming signal 104 can vary based on the frequency modulation used in that segment of the incoming signal 104.

Harmonics ratio values are determined based on the output signal at step 610. This may include, for example, one or more photodetectors identifying amplitudes associated with the first harmonic and the first subharmonic in the output signal 118. This may be done using a single detector (if the detector has adequate bandwidth) or using multiple detectors (such as is done in FIG. 5). This may also include the frequency modulation calculator 124 using the measured amplitudes associated with the first harmonic and the first subharmonic to calculate the ratio values 126. The ratio values 126 identify or are otherwise based on the instantaneous frequency deviations in the segments of the incoming signal 104.

The harmonics ratio values are decoded to recover information that has been encoded in the incoming signal at step 612. This may include, for example, the decoder 128 using the ratio values 126 to identify the frequency modulations in the segments of the incoming signal 104, which allows the decoder 128 to recover symbols from the incoming signal 104. The recovered information can be stored, output, or used in some manner at step 614. This may include, for example, the decode 128 providing the output signal 130 containing the recovered information to one or more destinations for suitable processing or other use. The exact processing or use of the recovered information can vary widely based on the application.

Although FIG. 6 illustrates one example of a method 600 for demodulation of frequency-modulated signals, various changes may be made to FIG. 6. For example, while shown as a series of steps, various steps in FIG. 6 may overlap, occur in parallel, occur in a different order, or occur any number of times.

In some embodiments, various functions described in this patent document are implemented or supported by a computer program that is formed from computer readable program code and that is embodied in a computer readable medium. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive (HDD), a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable storage device.

It may be advantageous to set forth definitions of certain words and phrases used throughout this patent document. The terms "application" and "program" refer to one or more computer programs, software components, sets of instructions, procedures, functions, objects, classes, instances, related data, or a portion thereof adapted for implementation in a suitable computer code (including source code, object code, or executable code). The term "communicate," as well as derivatives thereof, encompasses both direct and indirect communication. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

The description in the present application should not be read as implying that any particular element, step, or function is an essential or critical element that must be included in the claim scope. The scope of patented subject matter is defined only by the allowed claims. Moreover, none of the claims invokes 35 U.S.C. § 112(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," "system," "processor," or "controller" within a claim is understood and intended to refer to structures known to those skilled in the relevant art, as further modified or enhanced by the features of the claims themselves, and is not intended to invoke 35 U.S.C. § 112(f).

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. An apparatus comprising:
   a phase modulator configured to modulate a phase of an incoming frequency-modulated signal based on a clock signal to generate a phase-modulated signal, the clock signal associated with a clock frequency;
   an etalon configured to receive the phase-modulated signal and generate an output signal based on the phase-modulated signal;
   a detector configured to identify amplitudes associated with a first harmonic of the clock frequency and a first subharmonic of the clock frequency in the output signal; and
   a decoder configured to recover information encoded in the incoming frequency-modulated signal based on instantaneous frequency deviations of the incoming frequency-modulated signal, the instantaneous frequency deviations identified based on relative amplitudes of the first harmonic and the first subharmonic.

2. The apparatus of claim 1, wherein the detector is configured to measure the amplitudes of the first harmonic and the first subharmonic by measuring the amplitudes of the output signal over at least two points with different delays relative to the clock signal.

3. The apparatus of claim 2, wherein the detector comprises:
   a first detector configured to measure intensities of first portions of the output signal; and a second detector configured to measure intensities of second portions of the output signal.

4. The apparatus of claim 3, wherein the detector further comprises:
a first intensity modulator configured to provide the first portions of the output signal to the first detector and block the second portions of the output signal; and
a second intensity modulator configured to provide the second portions of the output signal to the second detector and block the first portions of the output signal.

5. The apparatus of claim 4, wherein:
the phase modulator and the first intensity modulator are configured to be controlled by the clock signal; and
the second intensity modulator is configured to be controlled by a delayed version of the clock signal.

6. The apparatus of claim 1, further comprising:
a frequency modulation calculator configured to generate harmonic amplitude ratio values based on the amplitudes associated with the first harmonic and the first subharmonic;
wherein the decoder is configured to recover the information encoded in the incoming frequency-modulated signal based on the harmonic amplitude ratio values.

7. The apparatus of claim 6, wherein the harmonic amplitude ratio values are related in a linear manner to the instantaneous frequency deviations of the incoming frequency-modulated signal over at least a portion of a bandwidth of the apparatus.

8. The apparatus of claim 6, wherein the harmonic amplitude ratio value for each segment of the incoming frequency-modulated signal is based on a ratio of the amplitude of the first subharmonic contained within the segment and the amplitude of the first harmonic contained within the segment.

9. The apparatus of claim 6, wherein the harmonic amplitude ratio value for each segment of the incoming frequency-modulated signal is determined as:

$$K \times \frac{(D1 - D2)}{(D1 + D2)}$$

where D1 represents the amplitude of the output signal measured at or near a leading edge of the clock signal, D2 represents the amplitude of the output signal measured at or near a trailing edge of the clock signal, and K represents a constant based on a free spectral range of the etalon.

10. The apparatus of claim 1, wherein:
the detector comprises at least one detector; and
a bandwidth of the at least one detector is lower than instantaneous frequency deviations of the incoming frequency-modulated signal.

11. The apparatus of claim 1, wherein the incoming frequency-modulated signal comprises one of: a radio frequency signal, an infrared signal, an optical signal, or an ultra-violet signal.

12. A method comprising:
receiving an incoming frequency-modulated signal;
modulating a phase of the incoming frequency-modulated signal based on a clock signal to generate a phase-modulated signal, the clock signal associated with a clock frequency;
generating an output signal based on the phase-modulated signal using an etalon;
identifying amplitudes associated with a first harmonic of the clock frequency and a first subharmonic of the clock frequency in the output signal; and
recovering information encoded in the incoming frequency-modulated signal based on instantaneous frequency deviations of the incoming frequency-modulated signal, the instantaneous frequency deviations identified based on relative amplitudes of the first harmonic and the first subharmonic.

13. The method of claim 12, wherein the amplitudes of the first harmonic and the first subharmonic are identified by measuring the amplitudes of the output signal over at least two points with different delays relative to the clock signal.

14. The method of claim 13, wherein:
a first detector measures intensities of first portions of the output signal; and
a second detector measures intensities of second portions of the output signal.

15. The method of claim 14, further comprising:
providing the first portions of the output signal to the first detector and blocking the second portions of the output signal from reaching the first detector; and
providing the second portions of the output signal to the second detector and blocking the first portions of the output signal from reaching the second detector.

16. The method of claim 15, wherein:
the first portions of the output signal are provided to the first detector based on the clock signal; and
the second portions of the output signal are provided to the second detector based on a delayed version of the clock signal.

17. The method of claim 12, further comprising:
generating harmonic amplitude ratio values based on the amplitudes associated with the first harmonic and the first subharmonic;
wherein the information encoded in the incoming frequency-modulated signal is recovered based on the harmonic amplitude ratio values.

18. The method of claim 17, wherein the harmonic amplitude ratio values are related in a linear manner to the instantaneous frequency deviations of the incoming frequency-modulated signal over at least a portion of a bandwidth of a receiver.

19. The method of claim 17, wherein the harmonic amplitude ratio value for each segment of the incoming frequency-modulated signal is based on a ratio of the amplitude of the first subharmonic contained within the segment and the amplitude of the first harmonic contained within the segment.

20. The method of claim 17, wherein the harmonic amplitude ratio value for each segment of the incoming frequency-modulated signal is determined as:

$$K \times \frac{(D1 - D2)}{(D1 + D2)}$$

where D1 represents the amplitude of the output signal measured at or near a leading edge of the clock signal, D2 represents the amplitude of the output signal measured at or near a trailing edge of the clock signal, and K represents a constant based on a free spectral range of the etalon.

21. The method of claim 12, wherein:
the amplitudes associated with the first harmonic and the first subharmonic are identified using at least one detector; and a bandwidth of the at least one detector is lower than instantaneous frequency deviations of the incoming frequency-modulated signal.

22. The method of claim 12, wherein the incoming frequency-modulated signal comprises one of: a radio frequency signal, an infrared signal, an optical signal, or an ultra-violet signal.

\* \* \* \* \*